(12) United States Patent
Mori

(10) Patent No.: US 12,080,523 B2
(45) Date of Patent: Sep. 3, 2024

(54) VACUUM PROCESSING APPARATUS AND METHOD FOR CONTROLLING VACUUM PROCESSING APPARATUS

(71) Applicant: Tokyo Electron Limited, Tokyo (JP)

(72) Inventor: Kiyoshi Mori, Fuchu (JP)

(73) Assignee: Tokyo Electron Limited, Tokyo (JP)

( * ) Notice: Subject to any disclaimer, the term of this patent is extended or adjusted under 35 U.S.C. 154(b) by 593 days.

(21) Appl. No.: 17/444,680

(22) Filed: Aug. 9, 2021

(65) Prior Publication Data
US 2022/0051876 A1 Feb. 17, 2022

(30) Foreign Application Priority Data
Aug. 17, 2020 (JP) .................. 2020-137294

(51) Int. Cl.
*H01J 37/32* (2006.01)
*H01J 37/244* (2006.01)

(52) U.S. Cl.
CPC ...... *H01J 37/32513* (2013.01); *H01J 37/244* (2013.01); *H01J 37/32715* (2013.01); *H01J 2237/2006* (2013.01); *H01J 2237/20285* (2013.01); *H01J 2237/3321* (2013.01); *H01J 2237/334* (2013.01)

(58) Field of Classification Search
None
See application file for complete search history.

(56) References Cited

U.S. PATENT DOCUMENTS

2016/0355927 A1\* 12/2016 Weaver ............ H01L 21/68785

FOREIGN PATENT DOCUMENTS

| JP | 2010-034132 A | 2/2010 |
|---|---|---|
| KR | 10-2016-0002855 A | 1/2016 |
| KR | 10-2020-0021293 A | 2/2020 |

\* cited by examiner

*Primary Examiner* — Charles Capozzi
(74) *Attorney, Agent, or Firm* — Armstrong Teasdale LLP

(57) ABSTRACT

The present disclosure relates to a vacuum processing apparatus. The vacuum processing apparatus includes a processing container capable of maintaining an inside thereof in a vacuum atmosphere, a stage provided in the processing container and on which a substrate is placed, a support member passing through an opening formed at a bottom of the processing container to support the stage from below, a holder part located outside the processing container, a flange part arranged around the opening on the outside of the processing container, and a sealing part configured to be expandable and contractible and provided inside the spherical bearing along the circumferential direction of the opening so as to airtightly seal at least a space between the flange part and the holder part.

8 Claims, 12 Drawing Sheets

VACUUM PROCESSING APPARATUS AND METHOD FOR CONTROLLING VACUUM PROCESSING APPARATUS

CROSS-REFERENCE TO RELATED APPLICATION

This application is based upon and claims the benefit of priority from Japanese Patent Application No. 2020-137294, filed on Aug. 17, 2020, the entire contents of which are incorporated herein by reference.

TECHNICAL FIELD

The present disclosure relates to a vacuum processing apparatus and a method for controlling the vacuum processing apparatus.

BACKGROUND

Patent Document 1 discloses a structure, in which a hemispherical body having a convex spherical shape and formed on a bottom surface of a stage, is brought into contact with a surface of a spherical bearing so as to support the stage such that an inclination of the stage is adjustable, in which a piezoelectric element is arranged so as to surround the spherical bearing, and in which the hemispherical body and the spherical bearing are separated from each other during adjustment of the inclination of the stage by extending the piezoelectric element.

PRIOR ART DOCUMENT

Patent Document

Patent Document 1: Japanese Laid-Open Patent Publication No. 2010-34132

SUMMARY

According to an embodiment of the present disclosure, a vacuum processing apparatus includes a processing container, a stage, a support member, a holder part, a flange part, and a sealing part. The stage is provided in the processing container and a substrate is placed thereon. The support member passes through an opening formed at a bottom of the processing container and supports the stage from below. The holder part is located outside the processing container and an end of the support member is fixed to the holder part to be integrally movable with the stage. The holder part includes an inner turn portion formed to close the opening from the outside of the processing container and forming a movable part of a spherical bearing along a circumferential direction of the opening. The flange part is arranged around the opening on the outside of the processing container and includes an outer turn portion engaged with the inner turn portion and forming a fixed part of the spherical bearing. The sealing part is configured to be expandable and contractible and provided inside the spherical bearing along the circumferential direction of the opening so as to airtightly seal at least a space between the flange part and the holder part.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a vacuum processing apparatus and a method of controlling the same disclosed herein will be described in detail with reference to the drawings. The vacuum processing apparatus and method of controlling the same disclosed herein are not limited by the following embodiments.

A processing container of a vacuum processing apparatus is deformed due to a pressure difference when internal pressure thereof is switched from an atmospheric state to a vacuum state. The processing container is also deformed according to a temperature change. When the processing container is deformed, stress due to the deformation of the processing container is transmitted to the stage, and an inclination of the stage may deviate from a desired inclination. Therefore, for example, in Patent Document 1, the inclination of the stage is adjustable by bringing the hemispherical body having a convex spherical shape and formed on a bottom surface of the stage into contact with a surface of the spherical bearing. In Patent Document 1, the piezoelectric element is arranged so as to surround the spherical bearing, and when adjusting the inclination of the stage, the piezoelectric element is extended to separate the hemispherical body and the spherical bearing from each other. However, in Patent Document 1, since the piezoelectric element is contracted so as to bring the hemispherical body and the spherical bearing into contact with each other after the adjustment of the inclination of the stage, particles may be generated in the processing container due to friction between the hemispherical body and the spherical bearing. Therefore, a technique for suppressing the generation of particles in the processing container while making the inclination of a stage adjustable is desired.

First Embodiment

[Configuration of Vacuum Processing Apparatus 100]

Figure 1:
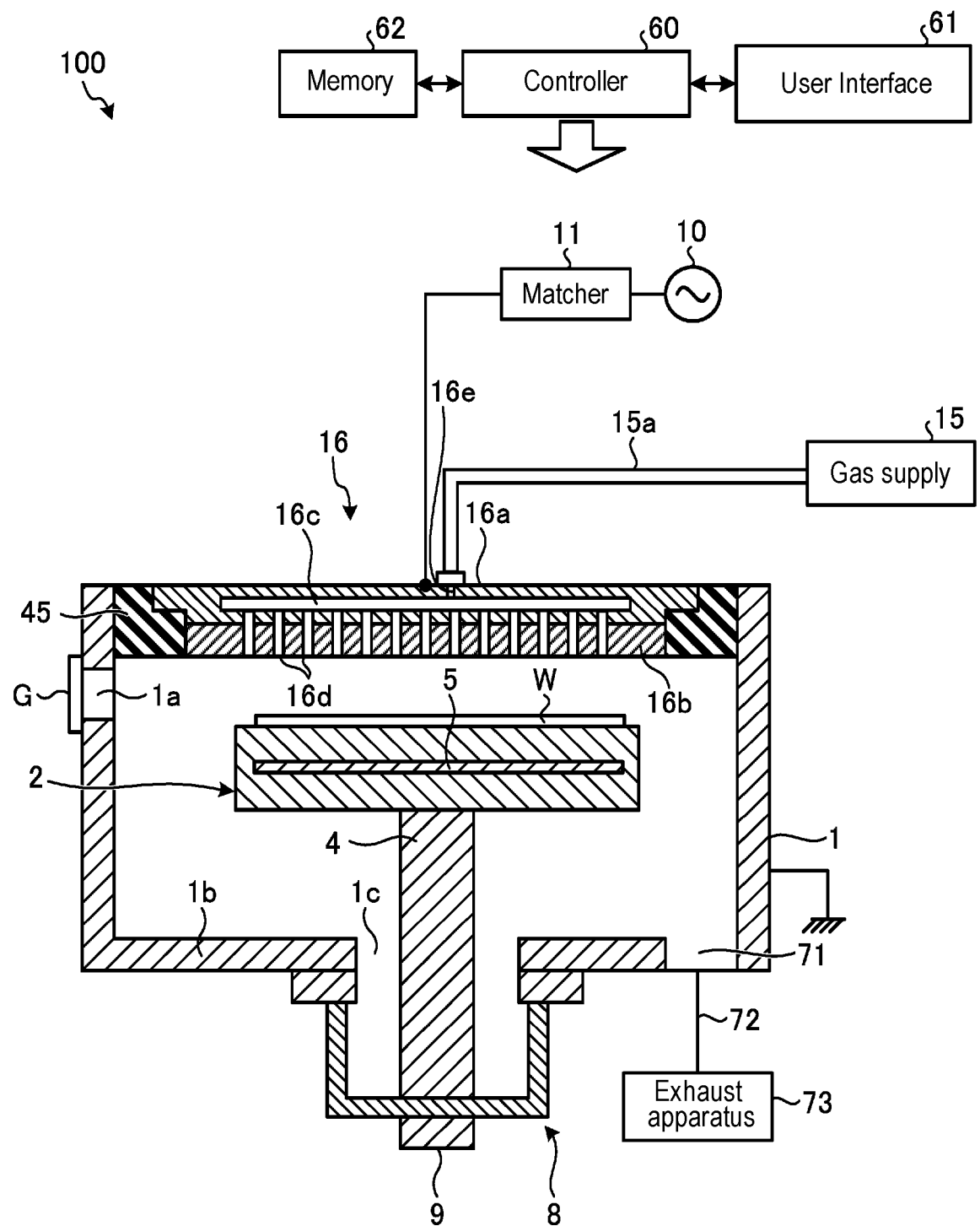
FIG. 1 is a cross-sectional view schematically illustrating an exemplary configuration of a vacuum processing apparatus according to a first embodiment.

A first embodiment will be described. First, a vacuum processing apparatus 100 according to the first embodiment will be described. In the following, a case where the vacuum processing apparatus 100 is used as an apparatus for forming a film will be described as an example. FIG. 1 is a cross-sectional view schematically illustrating an exemplary configuration of the vacuum processing apparatus 100 according to a first embodiment.

In an embodiment, the vacuum processing apparatus 100 is an apparatus that performs a plasma CVD process on a substrate W as a substrate process. The vacuum processing apparatus 100 illustrated in FIG. 1 has a processing container 1. The processing container 1 is cylindrical, and is made of a metal such as aluminum or nickel having, for example, an anodized film formed on the surface thereof. The processing container 1 is electrically set to a ground potential. The processing container 1 is airtightly configured so that inside thereof can be maintained in a vacuum atmosphere. The processing container 1 is provided with a stage 2 therein. The processing container 1 has an opening 1c formed at a bottom 1b which is the lower bottom surface thereof. The opening 1c is formed at a location under the stage 2.

The stage 2 is formed in a flat cylindrical shape. A substrate W to be processed, such as a semiconductor wafer, is placed on a top surface of the stage 2. The stage 2 substantially horizontally supports the substrate W placed thereon. The stage 2 is made of metal such as aluminum or nickel, or aluminum nitride (AlN) in which a metal mesh electrode is embedded, and also functions as a lower electrode. The stage 2 is supported from below by a support member 4. The support member 4 is formed in a cylindrical shape, extends vertically downwards, and passes through the opening 1c in the bottom 1b of the processing container 1. The opening 1c in the bottom 1b is formed to have a diameter larger than a diameter of the support member 4. A gap is provided between a peripheral surface of the support member 4 and a peripheral surface of the opening 1c.

A lower end of the support member 4 is located outside the processing container 1 and is supported by a support part 8. The support part 8 is provided so as to cover the opening 1c from the outside of the processing container 1 and is configured to be able to adjust an inclination of the stage 2 by changing an inclination of the support member 4. In addition, the support part 8 is provided with a rotational driving mechanism 9 configured to rotate the support member 4. The support member 4 is rotated by the rotational driving mechanism 9. The stage 2 is configured to be rotatable according to rotation of the support member 4. The detailed configuration of the support part 8 and the rotational driving mechanism 9 will be described later.

A heater 5 is built in the stage 2, so that it is possible to heat the substrate W placed on the stage 2 to a predetermined temperature using the heater 5. The stage 2 has therein a flow path (not illustrated) configured to circulate a coolant, and a temperature-controlled coolant may be circulated and supplied into the flow path by a chiller unit provided outside the processing container 1. The stage 2 may control the substrate W to a predetermined temperature by heating with the heater 5 and cooling with the coolant supplied from the chiller unit. The temperature of the stage 2 may be controlled only by the coolant supplied from the chiller unit without being equipped with the heater 5.

Further, an electrode may be embedded in the stage 2. The stage 2 may attract the substrate W placed on the top surface thereon by an electrostatic force generated by a DC voltage supplied to the electrode. In addition, the stage 2 is provided with lifting pins (not illustrated) for delivering the substrate W to and from a transport mechanism (not illustrated) provided outside the processing container 1.

A substantially disk-shaped shower head 16 is provided on an inner surface of the processing container 1 above the stage 2. The shower head 16 is supported above the stage 2 via an insulating member 45 such as ceramic. As a result, the processing container 1 and the shower head 16 are electrically insulated from each other. The shower head 16 is made of a conductive metal such as aluminum or nickel.

The shower head 16 has a ceiling plate member 16a and a shower plate 16b. The ceiling plate member 16a is provided so as to close the inside of the processing container 1 from above. The shower plate 16b is provided below the ceiling plate member 16a so as to face the stage 2. A gas diffusion space 16c is formed in the ceiling plate member 16a. The ceiling plate member 16a and the shower plate 16b have a large number of gas ejection holes 16d distributed therein and opened towards the gas diffusion space 16c.

The ceiling plate member 16a has a gas inlet 16e to introduce various types of gases into the gas diffusion space 16c. A gas supply path 15a is connected to the gas inlet 16e. A gas supply 15 is connected to the gas supply path 15a.

The gas supply 15 includes gas supply lines, which are connected to respective gas supply sources of various gases used for film formation. Each gas supply line appropriately branches corresponding to a film forming process, and is provided with control devices for controlling a gas flow rate, such as a valve (e.g., an opening and closing valve) and a flow controller (e.g., a mass flow controller). The gas supply 15 can control flow rates of various types of gases by controlling control devices such as an opening and closing valve and a flow controller provided in each gas supply line.

The gas supply 15 supplies various types of gases used for film formation to the gas supply path 15a. For example, the gas supply 15 supplies a raw-material gas for film formation to the gas supply path 15a. In addition, the gas supply 15 supplies a purge gas or a reaction gas that reacts with the raw-material gas to the gas supply path 15a. The gas supplied to the gas supply path 15a is diffused in the gas diffusion space 16c and is ejected from each gas ejection hole 16d.

A space surrounded by a bottom surface of the shower plate 16b and a top surface of the stage 2 forms a processing space in which a film forming process is performed. In addition, the shower plate 16b paired with the grounded stage 2 via the support member 4 and the processing container 1 comprises an electrode plate for forming a capacitively coupled plasma (CCP) in the processing space. A high-frequency power supply 10 is connected to the shower head 16 via a matcher 11, and high-frequency power (RF power) is supplied from the high-frequency power supply 10 to the gas supplied to the processing space via the shower head 16, thereby forming the CCP. Further, the high-frequency power supply 10 may be connected to the stage 2 instead of being connected to the shower head 16, and the shower head 16 may be grounded.

An exhaust port 71 is formed at the bottom of the processing container 1. An exhaust apparatus 73 is connected to the exhaust port 71 via an exhaust pipe 72. The exhaust apparatus 73 includes a vacuum pump or a pressure adjustment valve, and is configured to be able to reduce pressure inside the processing container 1 to a predetermined degree of vacuum by operating the vacuum pump and the pressure adjustment valve.

A side wall of the processing container 1 is provided with a carry-in and carry-out port 1a so as to load and unload the substrate W therethrough. A gate valve G is provided in the carry-in and carry-out port 1a so as to open and close the carry-in and carry-out port 1a.

The operation of the vacuum processing apparatus 100 configured as described above is wholly controlled by the controller 60. A user interface 61 and a memory 62 are connected to the controller 60.

The user interface 61 may be configured as an operation device, such as a keyboard, through which a process manager inputs commands to manage the vacuum processing apparatus 100, or a display device, such as a display that visualizes and displays an operating state of the vacuum processing apparatus 100. The user interface 61 accepts various operations. For example, the user interface 61 accepts a predetermined operation instructing start of plasma processing.

The memory 62 stores programs (software) for implementing various processes performed in the plasma processing apparatus 100 under control of the controller 60, or data such as processing conditions or process parameters. In addition, the programs or the data may be used in the state of being stored in a computer-readable computer storage medium (e.g., a hard disc, a CD, a flexible disc, or a semiconductor memory). Alternatively, the programs or data may be used online or the like by transmitting from another device at any time via, for example, a dedicated line.

The controller 60 is, for example, a computer including a processor, a memory, or the like. The controller 60 reads a program or data from the memory 62 based on an instruction from the user interface 61 or the like so as to control each part of the vacuum processing apparatus 100, thereby executing each process of a controlling method to be described later.

[Configuration of Support Part 8]

Figure 2:
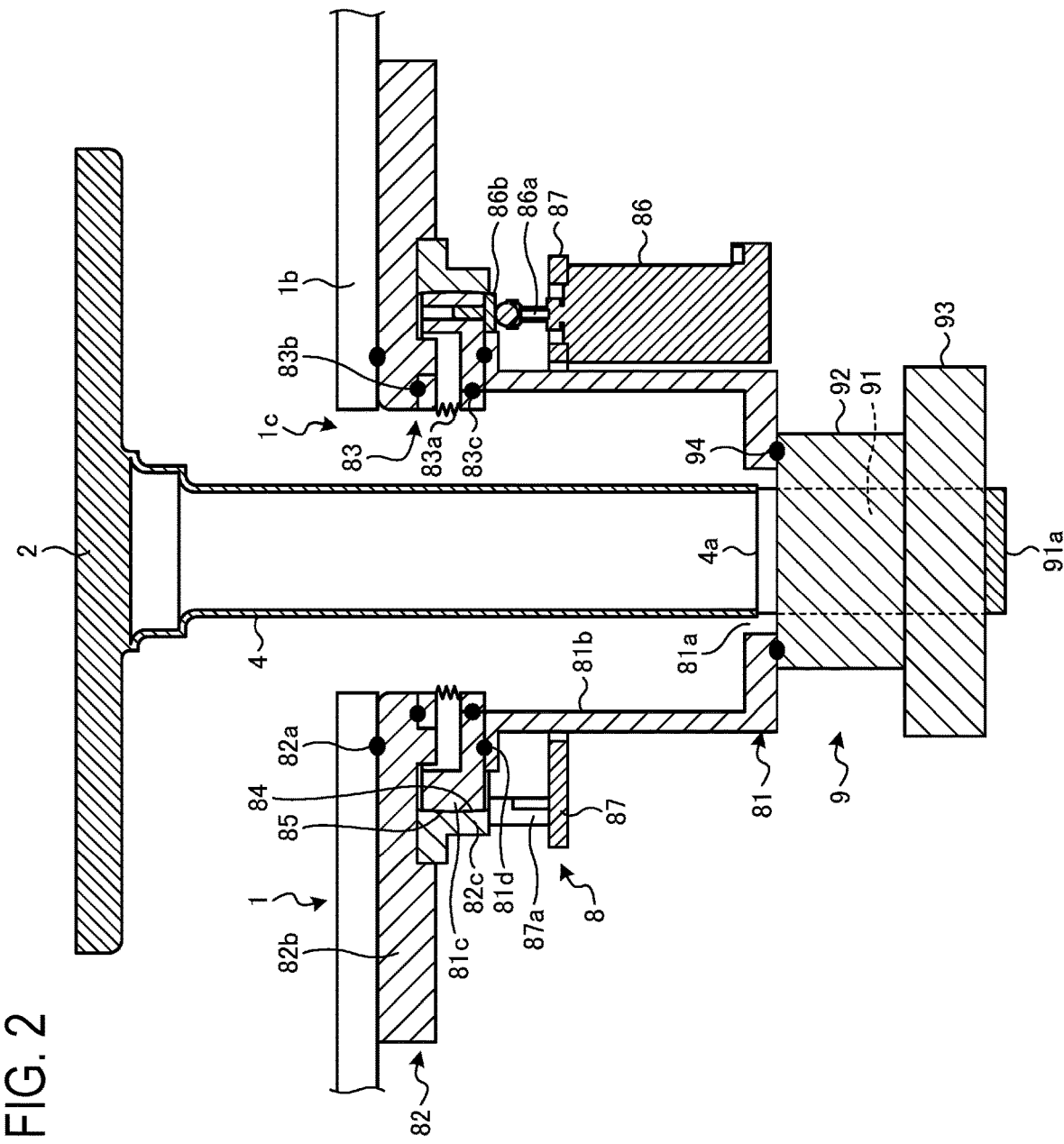
FIG. 2 is a cross-sectional view illustrating an exemplary configuration of a support part according to the first embodiment.
Figure 3:
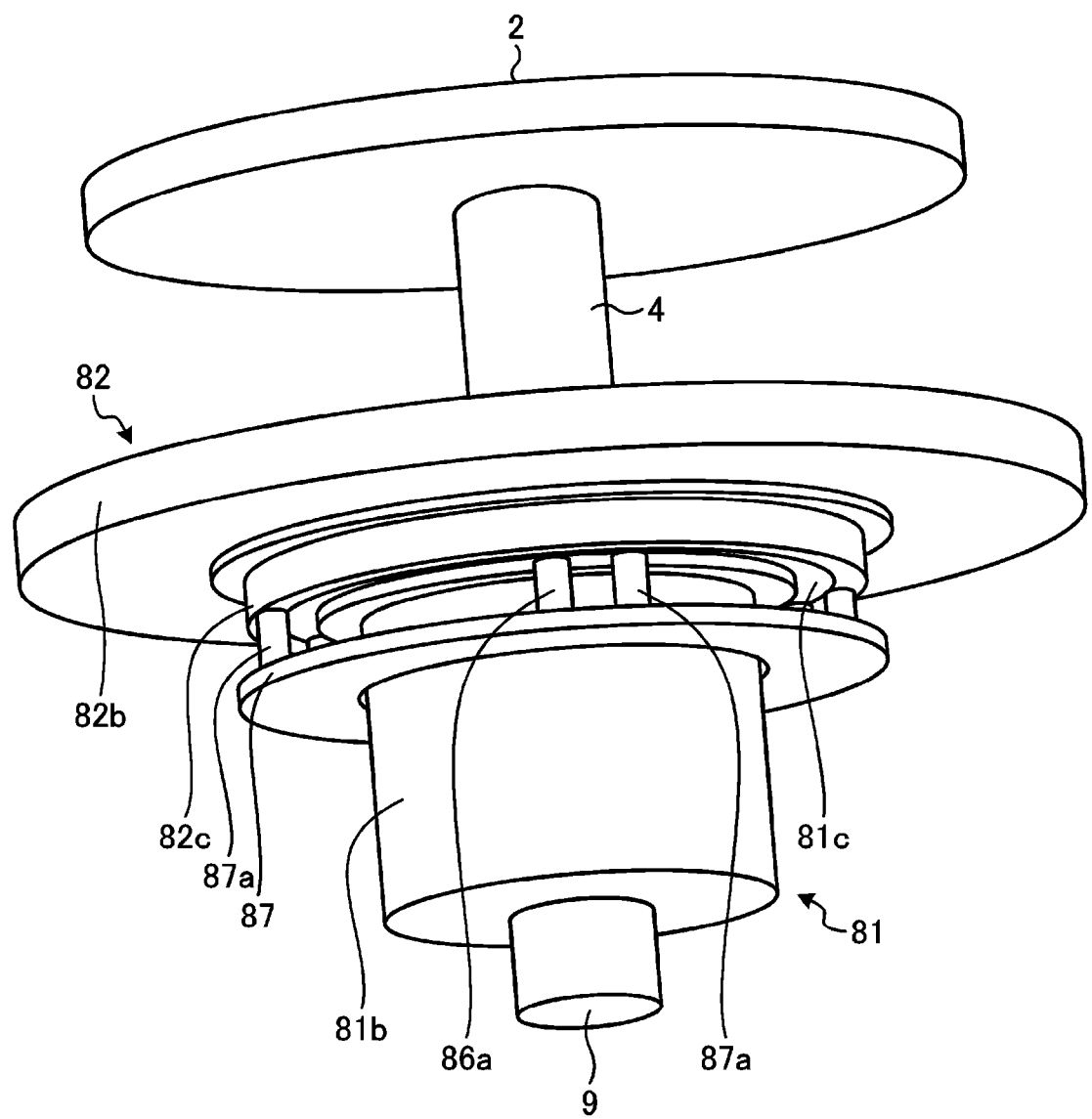
FIG. 3 is a perspective view illustrating the exemplary configuration of the support part according to the first embodiment.

FIG. 2 is a cross-sectional view illustrating an exemplary configuration of the support part 8 according to the first embodiment. FIG. 3 is a perspective view illustrating the exemplary configuration of the support part 8 according to the first embodiment. An opening 1c is formed at the bottom 1b of the processing container 1 at a position corresponding to a position for supporting the stage 2. A support member 4 is inserted into the opening 1c so as to support the stage 2 from below. The lower end 4a of the support member 4 located outside the processing container 1 is supported by the support part 8.

The support part 8 includes a holder part 81, a flange part 82, and a sealing part 83.

The holder part 81 is formed so as to cover the opening 1c from the outside of the processing container 1. For example, the holder part 81 has a diameter larger than a diameter of the opening 1c, and is formed in a cylindrical shape with the lower bottom portion closed. The lower end 4a of the support member 4 located outside the processing container 1 is fixed to the holder part 81 so that the holder part 81 is integrally movable with the stage 2.

Here, the support part 8 rotatably supports the cylindrical support member 4 using a cylindrical axis as a rotation axis by the rotational driving mechanism 9. The rotational driving mechanism 9 includes a rotary shaft 91, a vacuum seal 92, and a motor 93.

The holder part 81 has a hole 81a having a diameter larger than the diameter of the support member 4 and formed at a position corresponding to the lower end 4a of the support member 4. The hole 81a is formed to have a diameter slightly larger than the diameter of the support member 4.

The rotary shaft 91 passes through the hole 81a, is connected to the lower end 4a of the support member 4, and is configured to be rotatable in integration with the support member 4. A slip ring 91a is provided at a lower end of the rotary shaft 91. The slip ring 91a has an electrode, and is electrically connected to various wiring lines for supplying power to parts around the stage 2. For example, the slip ring 91a is electrically connected to a wiring line for supplying power to the heater 5 embedded in the stage 2. For example, when an electrostatic chuck configured to electrostatically attract a substrate W is provided on the stage 2, the slip ring 91a is electrically connected to a wiring line of a DC voltage applied to the electrostatic chuck.

A motor 93 is connected to the rotary shaft 91 and rotates the rotary shaft 91. When the rotary shaft 91 rotates, the stage 2 rotates via the support member 4. When the rotary shaft 91 rotates, the slip ring 91a also rotates together with the rotary shaft 91, but the electrical connection between the slip ring 91a and various wiring lines for supplying power to the parts around the stage 2 is maintained.

The vacuum seal 92 is, for example, a magnetic fluid seal. The vacuum seal 92 is provided around the rotary shaft 91. The vacuum seal 92 can maintain the rotation of the rotary shaft 91 while airtightly sealing the rotary shaft 91. The vacuum seal 92 is fixed to the bottom surface of the holder part 81. A contact portion between the vacuum seal 92 and the holder part 81 is sealed by a sealing member 94, such as an O-ring.

The support member 4 is fixed to the holder part 81 via the rotary shaft 91 and the vacuum seal 92, and thus moves integrally with the holder part 81. As the support member 4 moves, the stage 2 moves.

The holder part 81 includes an inner turn portion 84 forming a movable part of a spherical bearing in a circumferential direction of the opening 1c. For example, the holder part 81 has a cylindrical part 81b and a flat annular member 81c. The annular member 81c is fixed to an open upper end of the cylindrical part 81b. The annular member 81c is provided with a protruding spherical inner turn portion 84 along the outer circumference thereof. The inner turn portion 84 forms a movable part of the spherical bearing. A contact portion between the cylindrical part 81b and the annular member 81c is sealed by a sealing member 81d such as an O-ring. In the holder part 81, the cylindrical part 81b and the annular member 81c may be integrally formed.

Figure 4:
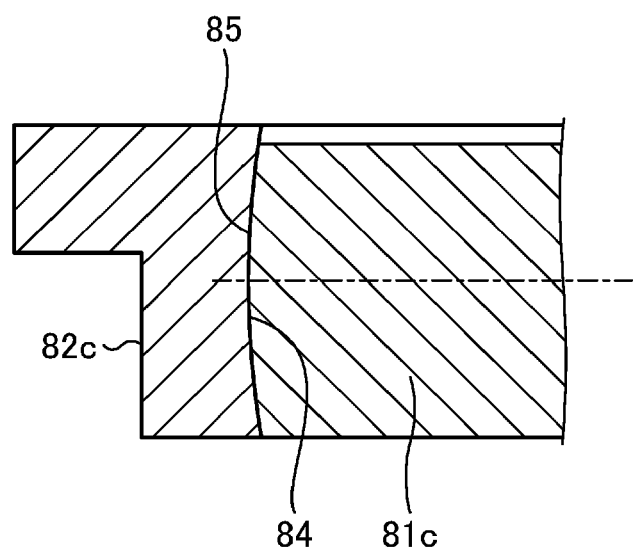
FIG. 4 is an enlarged view magnifying a spherical bearing part according to the first embodiment.

The flange part 82 is arranged around the opening 1c on the outside of the processing container 1. For example, the flange part 82 is formed in a disk shape and is arranged around the opening 1c. The flange part 82 is fixed to the bottom 1b of the processing container 1. A contact portion between the bottom 1b of the processing container 1 and the flange part 82 is sealed by a sealing member 82a such as an O-ring. The flange part 82 includes an outer turn portion 85 that is engaged with the inner turn portion 84 of the holder part 81 to form the fixed part of the spherical bearing. For example, the flange part 82 has a flat annular disk part 82b and an annular member 82c. The disk part 82b is fixed to the bottom 1b of the processing container 1. The annular member 82c is provided on a bottom surface of the disk part 82b, and protrudes from the bottom surface of the disk part 82b. The annular member 82c is formed to cover outer periphery of the annular member 81c of the holder part 81. The annular member 82c includes a spherical outer turn portion 85 concaved along the inner peripheral surface facing the annular member 81c. FIG. 4 is an enlarged view of a spherical bearing part according to the first embodiment. A convex spherical surface of the inner turn portion 84 and a concave spherical surface of the outer turn portion 85 are in contact with each other via surfaces and function as a spherical bearing. In the spherical bearing, the inner turn portion 84 can be tilted with respect to the outer turn portion 85 with reference to a spherical center of the spherical bearing by rotating the inner turn portion 84 up and down with respect to the outer turn portion 85. For example, when the substrate W is a semiconductor wafer having a diameter of 300 mm and the stage 2 has a size similar to that of the substrate W, the spherical bearing is formed to have a diameter of about 150 to 200 mm. The holder part 81 is supported by the spherical bearing such that an angle thereof can be changed with respect to the flange part 82. In addition, the flange part 82 may be formed by integrally forming the disk part 82b and the annular member 82c.

The sealing part 83 is expandable. The sealing part 83 is provided inside the spherical bearing along the circumferential direction of the opening 1c, and airtightly seals at least a space between the flange part 82 and the holder part 81. For example, a bellows 83a is provided as the sealing part 83. The bellows 83a is arranged so as to surround the periphery of the support member 4 along the circumferential direction of the opening 1c. The upper end of the bellows 83a is fixed to the flange part 82, and the lower end is fixed to the holder part 81. A contact portion of the bellows 83a with the flange part 82 on the upper end side is sealed by a sealing member 83b such as an O-ring. A contact portion of the bellows 83a with the holder part 81 on the lower end side is sealed by a sealing member 83c such as an O-ring. The bellows 83a is expandable and contractible. Therefore, the holder part 81 is expandable and contractible to maintain the airtightness between the flange part 82 and the holder part 81 even when the angle of the holder part 81 with respect to the flange part 82 is changed by the spherical bearing. In the present embodiment, the case where the space between the flange part 82 and the holder part 81 is airtightly sealed by the bellows 83a has been described. However, the upper end of the bellows 83a may be connected to the side surface of the opening 1c, and the bellows 83a may airtightly seal the space between the opening 1c and the holder part 81.

The holder part 81 is supported on the flange part 82 by the spherical bearing including the outer turn portion 85 and the inner turn portion 84. The support part 8 is capable of tilting the holder part 81 with respect to the flange part 82 by tilting the support part 8 with reference to the spherical center of the spherical bearing while receiving a thrust load generated during a vacuum with the spherical bearing. Since the stage 2 and the support member 4 are fixed to the holder part 81, they move together with the holder part 81. Therefore, it is possible to change the inclination of the stage 2 and the support member 4 by changing the inclination of the holder part 81.

Figure 5:
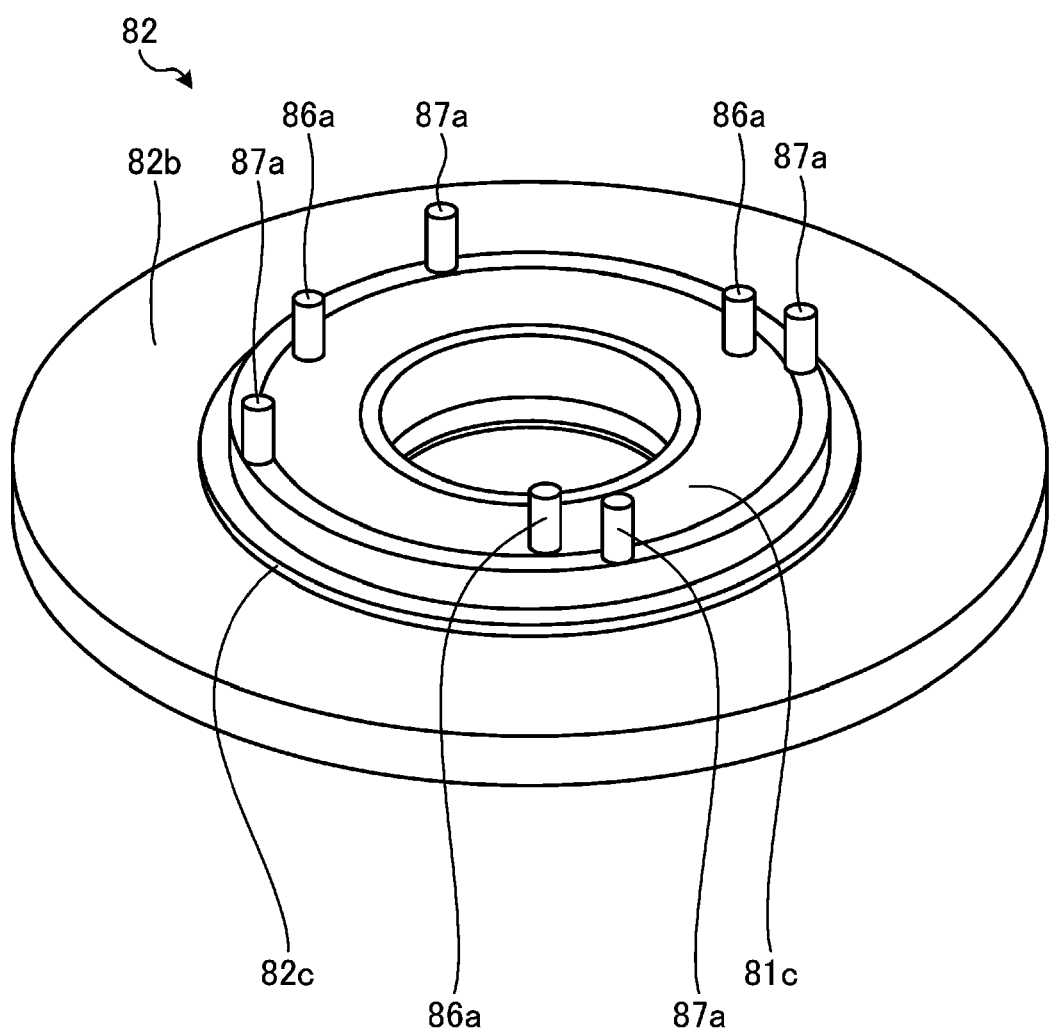
FIG. 5 is a view illustrating an exemplary configuration of a flange part according to the first embodiment.

The support part 8 includes an actuator 86 in order to change the inclination of the holder part 81 with respect to the flange part 82. The actuator 86 is directly or indirectly fixed to the flange part 82. For example, an annular base 87 is provided around the holder part 81. The base 87 is supported by a plurality of columns 87a extending from the flange part 82. FIG. 5 is a view illustrating an exemplary configuration of the flange part 82 according to the first embodiment. FIG. 5 illustrates the state in which a bottom surface of the flange part 82 is facing upward. In the present embodiment, the flange part 82 is provided with four columns 87a at equal intervals in the circumferential direction to support the base 87. The base 87 is fixed to the flange part 82 by the support columns 87a. The base 87 is provided with an actuator 86. At least three actuators 86 are arranged at intervals in the circumferential direction of the opening 1c. For example, three actuators 86 are arranged at equal intervals in the circumferential direction of the opening 1c. The actuators 86 are indirectly fixed to the flange part 82 via the base 87. In addition, four or more actuators 86 may be arranged.

Each actuator 86 has a rod 86a that is extendable and contractible. The rod 86a is directly or indirectly connected so as to come into contact with the holder part 81 (the annular member 81c). FIG. 5 illustrates rods 86a of each actuator 86 that are arranged at equal intervals. For example, the actuator 86 is provided therein with a servomotor and a ball screw. In the actuator 86, the ball screw is rotated by rotation of a rotary shaft of the servomotor, and the rod 86a extends and contracts with rotation of the ball screw. A thrust pad 86b is provided on a contact surface at the tip of each rod 86a. The thrust pad 86b may not be provided, but it is preferable to provide the pad because surface pressure becomes very high. The thrust pad 86b is preferably highly pressure-resistant by hardening. The thrust pad 86b is connected to the holder part 81.

The actuators 86 are capable of changing the inclination of the holder part 81 with respect to the flange part 82 by extending the rods 86a and pushing up the contact portions of the holder part 81 with the thrust pads 86b from below. The support part 8 is capable of tilting the stage 2 by pushing the holder part 81 by three actuators 86 evenly provided on the circumference thereof. The inclination of the stage 2 is adjusted based on the pressing amounts by the three actuators 86.

The inclination of the stage 2 adjusted by the plurality of actuators 86 may be specified by detecting the inclinations of the support member 4, the holder part 81, and the rotational driving mechanism 9 (e.g., the rotary shaft 91) using various detectors. Examples of the detectors may include a linear encoder, a gyro sensor, a 3-axis acceleration sensor, a laser tracker, and the like.

The actuators 86 extend and contract respective rods 86a under control of the controller 60. The controller 60 is capable of controlling the inclination of the stage 2 by controlling the extension and contraction of the rods 86a of the three actuators 86.

As described above, in the vacuum processing apparatus 100, when the pressure inside the processing container 1 is switched from the atmospheric state to the vacuum state, the processing container 1 is deformed due to the pressure difference. In addition, the temperature of the processing container 1 is changed due to the heat transferred thereto during a substrate process performed in the processing container 1, and the processing container 1 is also deformed by the temperature change. When the processing container 1 is deformed, stress due to the deformation of the processing container 1 is transmitted to the stage 2, and the inclination of the stage 2 may change.

Therefore, the vacuum processing apparatus 100 according to the embodiment is configured such that the inclination of the stage 2 is adjustable by the support part 8 having the above-described configuration. As a result, the vacuum processing apparatus 100 is capable of adjusting the inclination of the stage 2 to the original inclination even when the inclination of the stage 2 changes due to deformation of the processing container 1 or the like. As a result, the vacuum processing apparatus 100 is capable of reducing or eliminating deviation in the inclination of the stage 2 due to the deformation of the processing container 1. As a result, it is possible to improve in-plane uniformity in a substrate process such as a film forming process. For example, the support part 8 according to the present embodiment is capable of changing the inclination of the stage 2 by about ±5 degrees to 10 degrees at the maximum. In fact, when the support part 8 is capable of adjusting the angle of the stage 2 by about ±0.x degrees, it is possible to correct the inclination of the stage 2 caused due to deformation of the processing container 1 or the like.

In the vacuum processing apparatus 100 according to the embodiment, the spherical bearing for adjusting the inclination of the stage 2 is located on the atmosphere side and is shielded from the inside of the processing container 1 by the bellows 83a. As a result, the vacuum processing apparatus 100 is capable of blocking particles even when particles are generated due to friction or the like on the spherical bearing when adjusting the inclination of the stage 2, thereby suppressing the generation of particles in the processing container 1.

As described above, the vacuum processing apparatus 100 according to the present embodiment is capable of suppressing the generation of particles in the processing container 1 while making it possible to adjust the inclination of the stage 2.

[Specific Example of Flow of Method of Controlling Vacuum Processing Apparatus]

Figure 6:
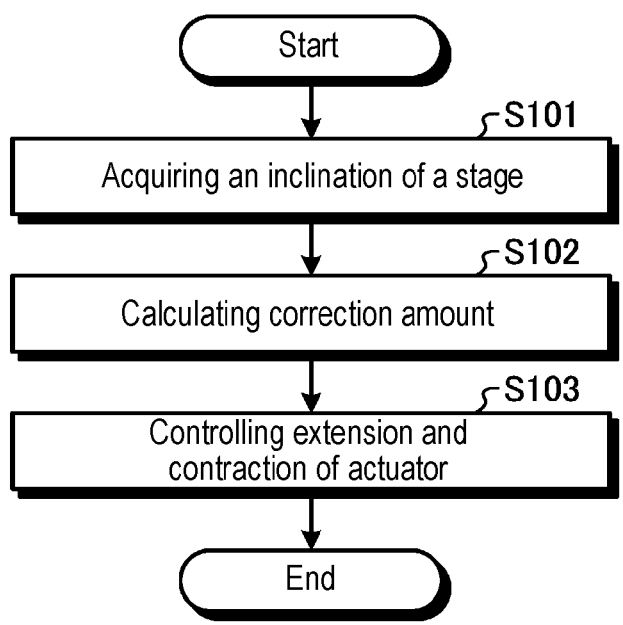
FIG. 6 is a flowchart illustrating an exemplary flow of a method of controlling the vacuum processing apparatus according to the first embodiment.

Next, a specific example of a flow of a method of controlling the vacuum processing apparatus 100 will be described. FIG. 6 is a flowchart illustrating an exemplary flow of a method of controlling the vacuum processing apparatus 100 according to the first embodiment.

The controller 60 acquires an inclination of the stage 2 (step S101). The inclination of the stage 2 may be acquired by detecting inclinations of the support member 4, the holder part 81, and the rotational driving mechanism 9 using various detectors. Further, the measurement result of the inclination of the stage 2 may be acquired by inputting it from the user interface 61.

The controller 60 calculates a correction amount for setting the stage 2 to a desired inclination from the acquired inclination of the stage 2 (step S102). For example, the controller 60 calculates, as correction amounts, direction and an angle that cause the stage 2 to be tilted in order to make the stage 2 to be at a desired inclination.

The controller 60 controls extension and contraction of each actuator 86 so as to achieve the inclination by the calculated correction amount (step S103), and ends the process. As each actuator 86 extends and contracts, the inclination of the stage 2 is corrected.

[Effect]

As described above, the vacuum processing apparatus 100 according to the first embodiment includes the processing container 1, the stage 2, the support member 4, the holder part 81, the flange part 82, and the sealing part 83 (the bellows 83a). The processing container 1 is configured to be capable of maintaining the inside thereof in a vacuum atmosphere. The stage 2 is provided in the processing container 1, and a substrate W is placed on the stage 2. The support member 4 penetrates the opening 1c formed at the bottom 1b of the processing container 1 and supports the stage 2 from below. The holder part 81 is located outside the processing container 1, and the lower end 4a of the support member 4 is fixed to the holder part 81 so that the holder part 81 is integrally movable with the stage 2. The holder part 81 is formed so as to cover the opening 1c from the outside of the processing container 1. The holder part 81 includes an inner turn portion 84 forming a movable part of the spherical bearing in the circumferential direction of the opening 1c. The flange part 82 is arranged around the opening 1c on the outside of the processing container 1. The flange part 82 includes an outer turn portion 85 that is engaged with the inner turn portion 84 to form the fixed part of the spherical bearing. The sealing part 83 is expandable and contractible, is provided inside the spherical bearing along the circumferential direction of the opening 1c, and airtightly seals at least the space between the flange part 82 and the holder part 81. As a result, the vacuum processing apparatus 100 is capable of suppressing the generation of particles in the processing container 1 while making it possible to adjust the inclination of the stage 2.

In addition, the vacuum processing apparatus 100 according to the first embodiment further includes the actuators 86 and the controller 60. The actuators 86 are provided so that the rods 86a, which are fixed to the flange part 82 and are extendable and contractible, come into contact with the holder part 81. The controller 60 adjusts the inclination of the holder part 81 and the stage 2 by controlling the extension and contraction of the rods 86a of the actuators 86. As a result, the vacuum processing apparatus 100 is capable of adjusting the inclination of the stage 2 by causing the rods 86a of the actuators 86 to extend and contract under the control of the controller 60.

In addition, at least three actuators 86 are arranged at intervals in the circumferential direction of the opening 1c. As a result, the vacuum processing apparatus 100 is capable of adjusting the inclination of the stage 2 in any direction.

Second Embodiment

[Configuration of Vacuum Processing Apparatus 100]

Figure 7:
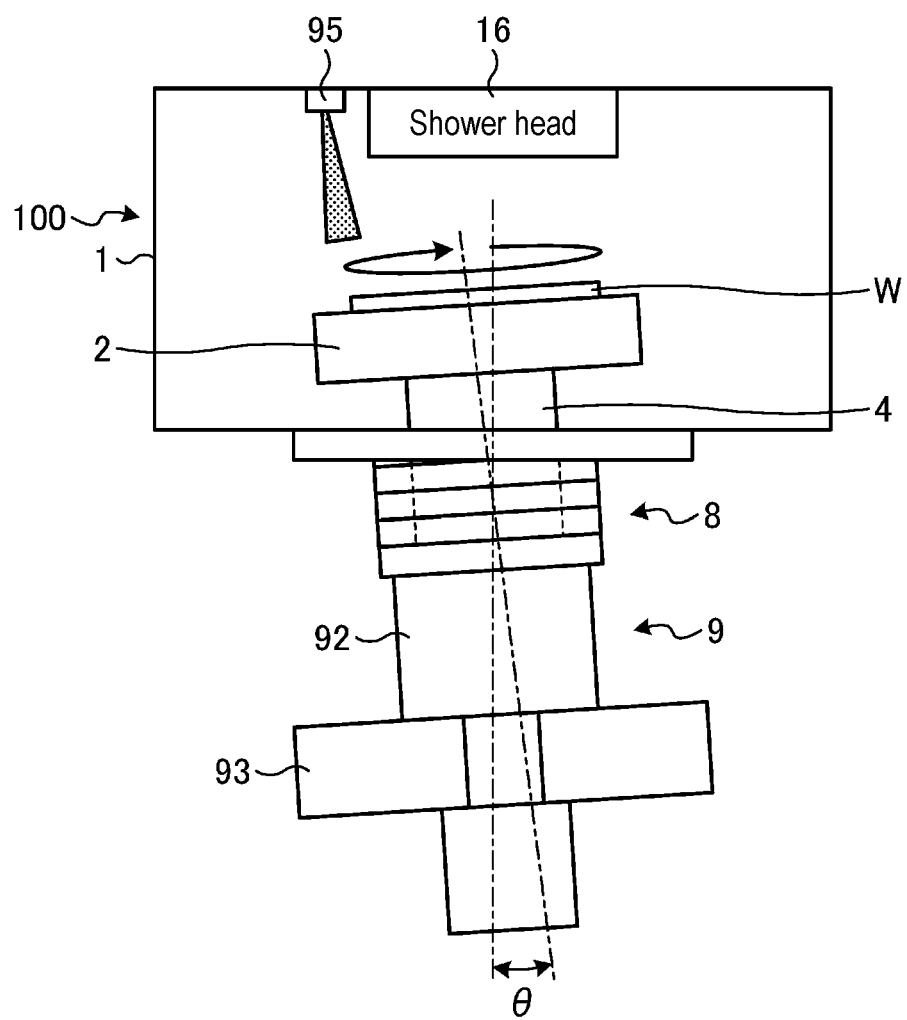
FIG. 7 is a schematic view illustrating an exemplary configuration of a vacuum processing apparatus according to a second embodiment.

Next, a second embodiment will be described. Since the vacuum processing apparatus 100 according to the second embodiment has substantially the same configuration as the vacuum processing apparatus 100 according to the first embodiment, different parts will be mainly described. FIG. 7 is a schematic view illustrating an exemplary configuration of a vacuum processing apparatus 100 according to the second embodiment. FIG. 7 simplifies the configuration of the vacuum processing apparatus 100 and illustrates parts related to the description. The same parts as those of the vacuum processing apparatus 100 according to the first embodiment are denoted by the same reference numerals, and the description thereof will be omitted.

In the vacuum processing apparatus 100, a film thickness sensor 95 is arranged around the shower head 16. The film thickness sensor 95 is configured to be able to detect the film thickness of a substrate W located within a predetermined detection range in a non-contact manner.

The stage 2 is supported by a support member 4. A lower end of the support member 4 is located outside the processing container 1 and is supported by the support part 8. In addition, the support part 8 is configured to be able to adjust the inclination of the stage 2 by changing an inclination of the support member 4. Furthermore, the support part 8 rotatably supports the cylindrical support member 4 using a cylindrical axis as a rotation axis by the rotational driving mechanism 9.

The controller 60 controls the actuators 86 such that the stage 2 is tilted and the substrate W placed on the stage 2 is located within a detection range of the film thickness sensor 95. In addition, the controller 60 controls the rotational driving mechanism 9 to rotate the support member 4 so as to rotate the stage 2. The controller 60 measures the film thickness of the film on the substrate W using the film thickness sensor 95. When it is not necessary to measure the film thickness in a circumferential direction of the substrate W, the stage 2 does not have to be rotated. For example, when measuring the film thickness at a plurality of locations in the radial direction of the substrate W, the controller 60 may move the detection range of the film thickness sensor 95 in the radial direction of the substrate W by changing the inclination of the stage 2 and may measure the film thickness using the film thickness sensor 95.

Figure 8:
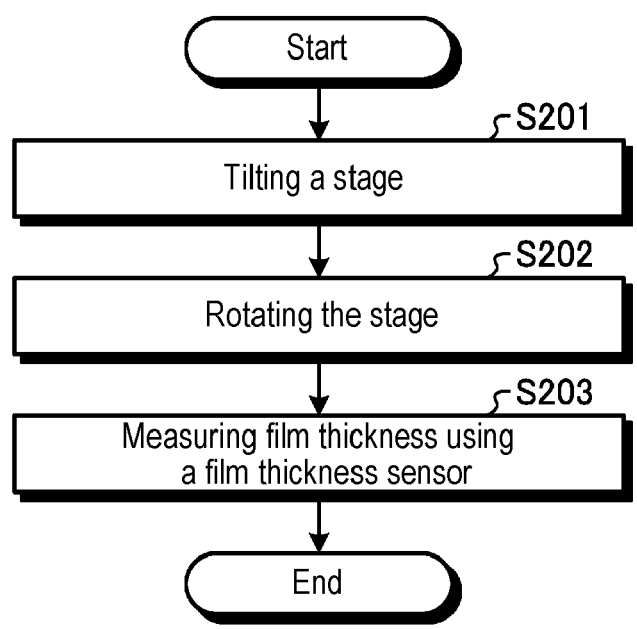
FIG. 8 is a flowchart illustrating an exemplary flow of a method of controlling the vacuum processing apparatus according to the second embodiment.

FIG. 8 is a flowchart illustrating an exemplary flow of a method of controlling the vacuum processing apparatus 100 according to the second embodiment.

The controller 60 controls the actuators 86 such that the stage 2 is tilted and the substrate W placed on the stage 2 is located within the detection range of the film thickness sensor 95 (step S201). For example, the controller 60 controls the plurality of actuators 86 to tilt the stage 2 until the substrate W placed on the stage 2 is located within the detection range of the film thickness sensor 95.

The controller 60 controls the rotational driving mechanism 9 to rotate the support member 4 so as to rotate the stage 2 (step S202). The controller 60 measures the thickness of the film on the substrate W using the film thickness sensor 95 (step S203).

In this way, in the vacuum processing apparatus 100, it is possible to move the substrate W placed on the stage 2 into the detection range of the film thickness sensor 95. As a result, the vacuum processing apparatus 100 is capable of detecting the film thickness in real time during the execution of a substrate process even when it is impossible to arrange the film thickness sensor 95 outside the periphery of the shower head 16 facing the stage 2.

[Effect]

As described above, the vacuum processing apparatus 100 according to the second embodiment further includes a shower head 16 (the upper electrode) and the film thickness sensor 95. The shower head 16 is arranged in the processing container 1 so as to face the stage 2. A film thickness sensor 95 is arranged around the shower head 16 and is configured to be able to detect the film thickness of a substrate W located within a predetermined detection range in a non-contact manner. In the method of controlling the vacuum processing apparatus 100 according to the second embodiment, actuators 86 are controlled such that the stage 2 is tilted and the substrate W placed on the stage 2 is located within the detection range of the film thickness sensor 95. As a result, the vacuum processing apparatus 100 is capable of detecting the film thickness in real time during the execution of a substrate process even when the film thickness sensor 95 is arranged around the shower head 16 facing the stage 2.

Third Embodiment

[Configuration of Vacuum Processing Apparatus 100]

Figure 9:
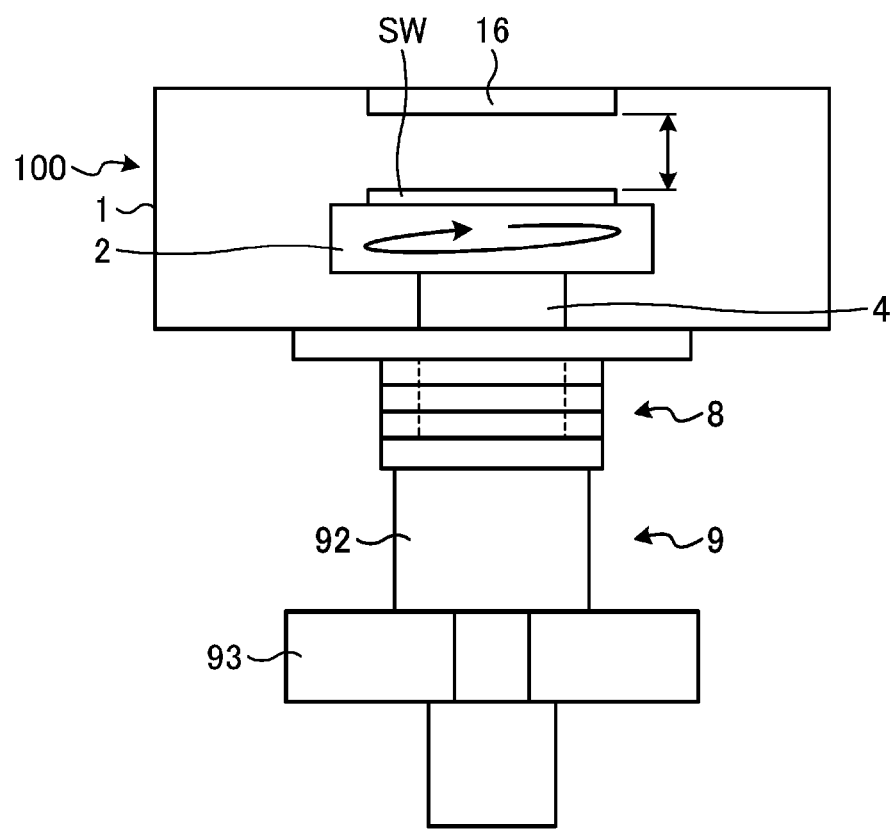
FIG. 9 is a schematic view illustrating an exemplary configuration of a vacuum processing apparatus according to a third embodiment.

Next, a third embodiment will be described. Since a vacuum processing apparatus 100 according to the third embodiment has substantially the same configuration as the vacuum processing apparatus 100 according to the first embodiment, different parts will be mainly described. FIG. 9 is a schematic view illustrating an exemplary configuration of the vacuum processing apparatus 100 according to the third embodiment. FIG. 9 simplifies the configuration of the vacuum processing apparatus 100 and illustrates parts related to the description. The same parts as those of the vacuum processing apparatus 100 according to the first embodiment are denoted by the same reference numerals, and the description thereof will be omitted.

In the vacuum processing apparatus 100, a distance measurement substrate SW configured to be capable of measuring the distance with the shower head 16 (hereinafter, appropriately referred to as a "gap") is arranged on the stage 2. The distance measurement substrate SW has a wireless communication function of transmitting a gap measured for each of the plurality of positions within the placement surface of the stage 2 to the controller 60 as a measurement result. The controller 60 measures the gap between the shower head 16 and the stage 2 using the distance measurement substrate SW. The controller 60 controls the actuators 86 such that the stage 2 is parallel to the shower head 16 based on the result of measurement of the measured gap.

Figure 10:
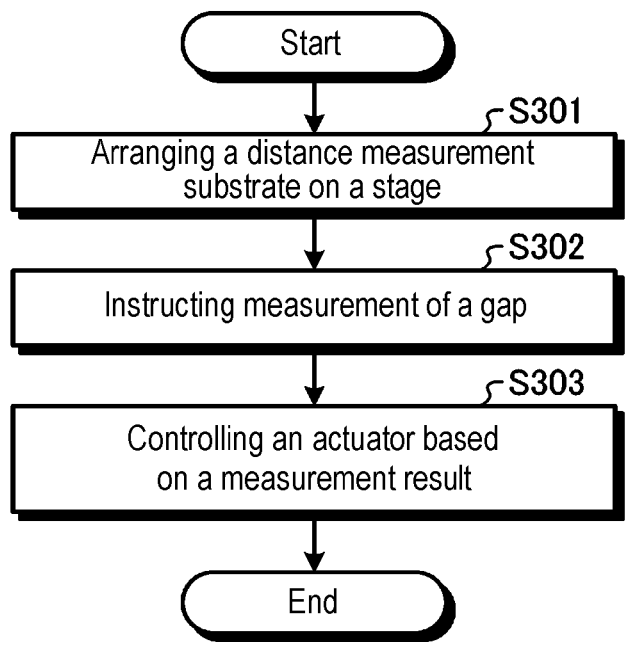
FIG. 10 is a flowchart illustrating an exemplary flow of a method of controlling the vacuum processing apparatus according to the third embodiment.

FIG. 10 is a flowchart illustrating an exemplary flow of a method of controlling the vacuum processing apparatus 100 according to the third embodiment.

The controller 60 arranges the distance measurement substrate SW on the stage 2 (step S301).

The controller 60 instructs the distance measurement substrate SW to measure a gap (step S302). The distance measurement substrate SW informs the controller 60 of a gap measured at each of the plurality of positions in the circumferential direction of the stage 2 as a measurement result. In addition, the gap measurement instruction may be transmitted from other than the controller 60.

The controller 60 controls the actuators 86 such that the stage 2 is parallel to the shower head 16 based on the result of measurement by the distance measurement substrate SW (step S303). For example, the controller 60 controls the actuators 86 such that the distances (that is, gaps) at a plurality of positions in the placement surface of the stage 2 are within a predetermined range.

As described above, in the vacuum processing apparatus 100, it is possible to make the gaps uniform at a plurality of positions in the placement surface of the stage 2 without opening the processing container 1. As a result, the vacuum processing apparatus 100 is capable of improving the in-plane uniformity of a substrate process on the substrate W while maintaining the vacuum state of the processing container 1.

[Effect]

As described above, the vacuum processing apparatus 100 according to the third embodiment further includes a shower head 16 (the upper electrode). The shower head 16 is arranged in the processing container 1 so as to face the stage 2. In the method of controlling the vacuum processing apparatus 100 according to the third embodiment, a distance measurement substrate SW that can measure a distance between the stage 2 and the shower head 16 at each of a plurality of positions within a placement surface of the stage 2, is arranged on the stage 2. In addition, in the method of controlling the vacuum processing apparatus 100, actuators 86 are controlled such that the stage 2 is parallel to the shower head 16 based on the result of measurement by the distance measurement substrate SW. As a result, the vacuum processing apparatus 100 is capable of improving the in-plane uniformity of a substrate process on the substrate W while maintaining the vacuum state in the processing container 1.

Fourth Embodiment

[Configuration of Vacuum Processing Apparatus 100]

Next, a fourth embodiment will be described. Since the vacuum processing apparatus 100 according to the fourth embodiment has substantially the same configuration as the vacuum processing apparatus 100 according to the first embodiment, different parts will be mainly described.

In the vacuum processing apparatus 100, measurement data indicating a state of a substrate W and an inclination of the stage 2 are stored in the memory 62 for each substrate process executed in the processing container 1. The state of the substrate W subjected to a substrate process may be measured by providing a sensor in the processing container 1, or the substrate W carried out from the vacuum processing apparatus 100 after the substrate process may be measured by another device. The controller 60 acquires measurement data measured for each substrate process executed in the processing container 1 and indicating the inclination of the stage 2 relative to the state of the substrate W, which satisfies a predetermined condition. For example, the controller 60 reads measurement data from the memory 62 of the controller 60 and acquires the measurement data. The controller 60 sequentially executes substrate processes in the processing container 1, and controls the actuators 86 such that the stage 2 is at an angle corresponding to a substrate process based on the measurement data whenever a time for switching a substrate process arrives.

Figure 11:
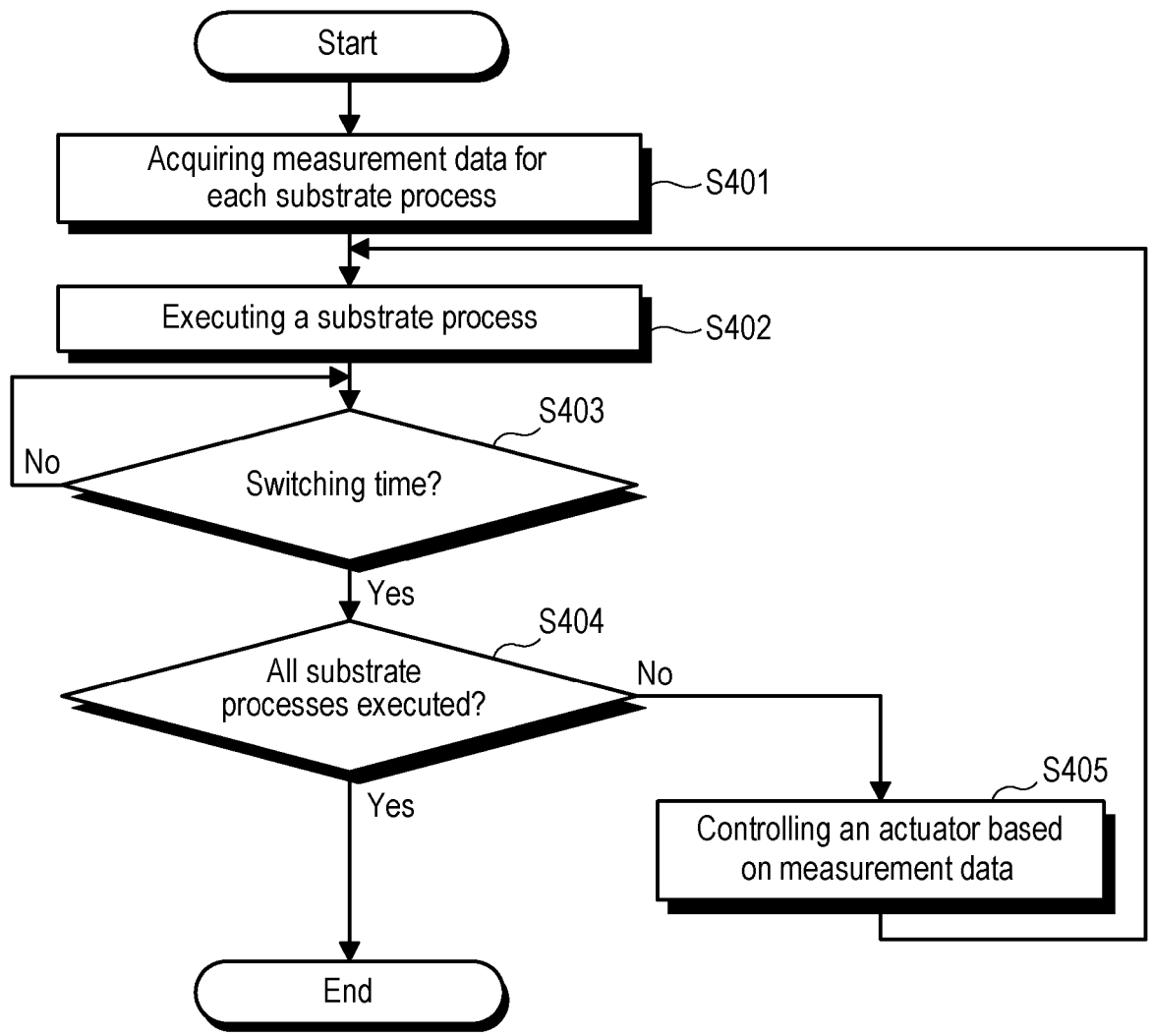
FIG. 11 is a flowchart illustrating an exemplary flow of a method of controlling the vacuum processing apparatus according to a fourth embodiment.

FIG. 11 is a flowchart illustrating an exemplary flow of a method of controlling the vacuum processing apparatus 100 according to the fourth embodiment.

The controller 60 acquires measurement data measured for each substrate process executed in the processing container 1 and indicating an inclination of the stage 2 relative to a state of the substrate W, which satisfies a predetermined condition (step S401). For example, the controller 60 reads measurement data from the memory 62 of the controller 60 and acquires the measurement data. The state of the substrate W is, for example, a numerical value representing quality of a film formed on a substrate W through a substrate process. When the measurement data is stored in another device, the controller 60 may acquire the measurement data from the other device via a network. In addition, the controller 60 may generate and acquire measurement data through machine learning based on the inclination of the stage 2 relative to the state of the substrate W for each substrate process.

The controller 60 executes a substrate process in the processing container 1 (step S402).

The controller 60 determines whether time for switching the substrate process that is being executed has arrived (step S403). When the time for switching has not arrived (step S403: No), the controller 60 continues the substrate process that is being executed.

On the other hand, when the switching time has arrived (step S403: "Yes"), the controller 60 determines whether the execution of all of the substrate processes are completed (step S404). When the execution of all of the substrate processes are not completed (step S404: "No"), the controller 60 controls the plurality of actuators 86 based on the measurement data acquired in step S401 (step S405). That is, the controller 60 refers to the measurement data and obtains the inclination of the stage 2 corresponding to the next substrate process to be performed at a switching destination. Then, the controller 60 controls the plurality of actuators 86 such that the inclination of the stage 2 is at the obtained inclination. After controlling the actuators 86, the controller 60 returns the process to step S402, and executes the next substrate process at the switching destination in the processing container 1.

Meanwhile, when execution of all of the substrate processes are completed (step S404: "Yes"), the controller 60 terminates the process.

In this way, the vacuum processing apparatus 100 can dynamically adjust the position and inclination of the stage 2 for each substrate process. As a result, the vacuum processing apparatus 100 can obtain an optimal processing result for each substrate process when substrate processes are continuously and sequentially executed.

[Effect]

As described above, in the method of controlling the vacuum processing apparatus 100 according to the fourth embodiment, the measurement data measured for each substrate process executed in the processing container 1 and indicating the inclination of the stage 2 relative to the state of the substrate W, which satisfies a predetermined condition, is acquired. In the method of controlling the vacuum processing apparatus 100, substrate processes are sequentially executed in the processing container 1. In the method of controlling the vacuum processing apparatus 100, the actuators 86 are controlled based on the measurement data whenever a time for switching a substrate process arrives. As a result, the vacuum processing apparatus 100 can obtain an optimal processing result for each substrate process when the substrate process is continuously and sequentially executed.

Although an embodiment has been described above, it should be considered that the embodiments disclosed herein are illustrative and are not restrictive in all respects. In addition, the embodiments described above may be omitted, replaced, or modified in various forms without departing from the scope and spirit of the claims.

For example, in the embodiments described above, an example in which the vacuum processing apparatus 100 is an apparatus that performs a plasma CVD process as a substrate process has been described. However, the technique disclosed herein is not limited thereto. The technique disclosed herein may be applied to any apparatus that performs other substrate processes such as plasma etching. That is, the technique disclosed herein may be adopted in any plasma processing apparatus. For example, the vacuum processing apparatus 100 may be any type of plasma processing apparatus, such as a capacitively coupled plasma (CCP) type apparatus, an inductively coupled plasma (ICP) type apparatus, or a plasma processing apparatus that excites gas using surface waves such as microwaves.

Further, in the embodiments described above, the case where the entire circumferential surfaces of the inner turn portion 84 forming the movable part of the spherical bearing and the outer turn portion 85 forming the fixed part are formed in a spherical shape has been described as an example. However, the technique disclosed herein is not limited thereto. A part of the peripheral surfaces of the inner turn portion 84 and the outer turn portion 85 may be spherical. For example, three or more portions spaced apart from each other on the circumferential surfaces of the inner turn portion 84 and the outer turn portion 85 may be spherical. For example, the inner turn portion 84 and the outer turn portion 85 may each have a spherical shape in the vicinity of a position at which they are in contact with the thrust pad 86b. For example, the inner turn portion 84 and the outer turn portion 85 may each have a spherical shape in a predetermined range including a portion in which they are in contact with the thrust pad 86b.

In the embodiments described above, the case where the spherical shapes of the inner turn portion 84 and the outer turn portion 85 are formed with the same radius of curvature and configured as a spherical bearing in which the inner turn portion 84 and the outer turn portion 85 are in contact via surfaces has been described as an example. However, the technique disclosed herein is not limited thereto. The spherical bearing formed by the inner turn portion 84 and the outer turn portion 85 may be configured as a self-aligning bearing or a ball bearing.

Figure 12:
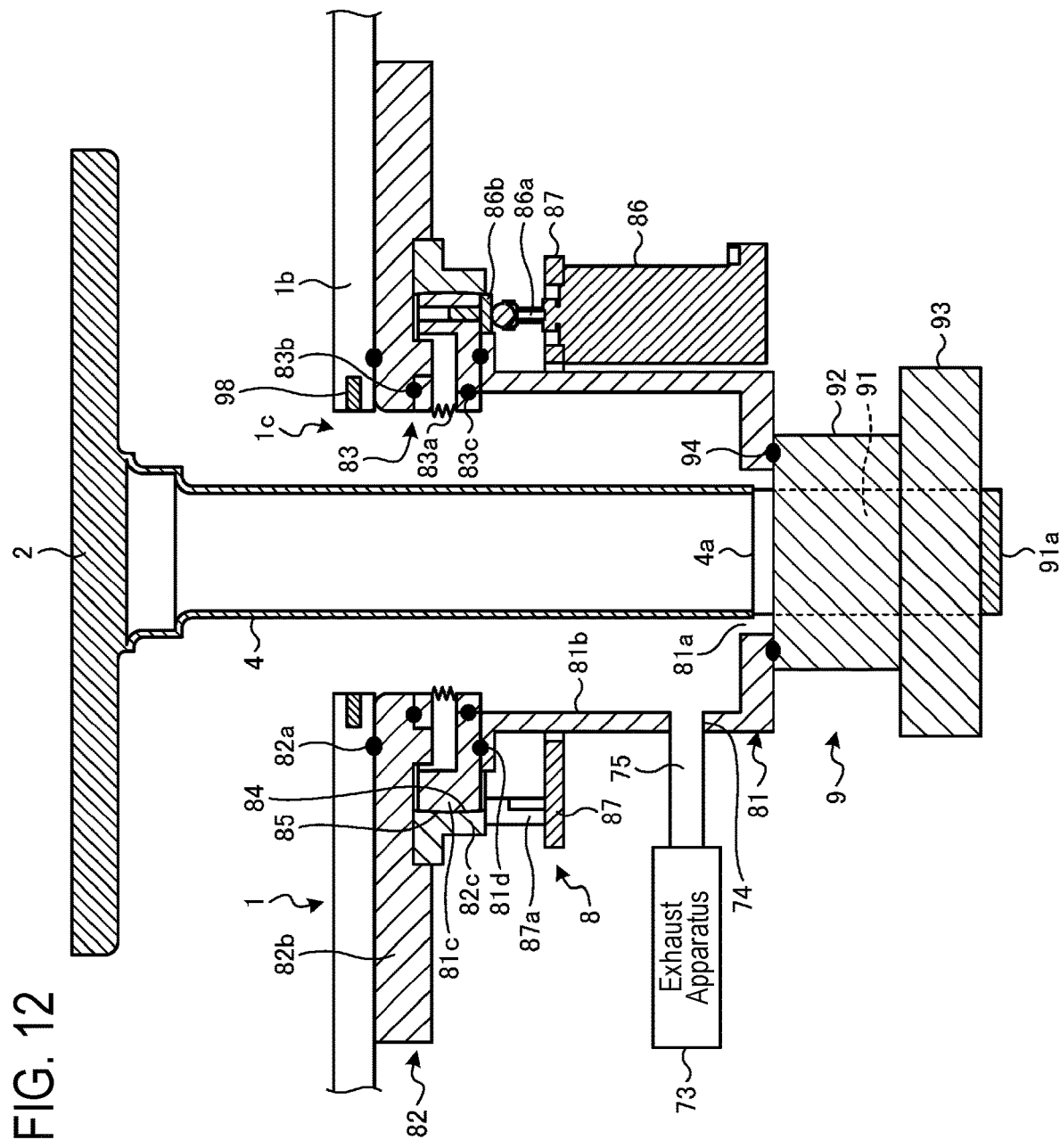
FIG. 12 is a cross-sectional view illustrating another exemplary configuration of a support part according to another embodiment.

In the embodiments, the case where the exhaust port 71 connected to the exhaust apparatus 73 is provided on an end of the bottom of the processing container 1 has been described as an example. However, the technique disclosed herein is not limited thereto. The holder part 81 may be provided with an exhaust for exhausting the inside of the processing container 1. In addition, a plurality of gas output ports for outputting a predetermined gas may be provided on a side surface of the opening 1c at intervals in the circumferential direction. FIG. 12 is a cross-sectional view illustrating another exemplary configuration of a support part according to another embodiment. The same parts as those of the support part 8 according to the first embodiment illustrated in FIG. 2 are denoted by the same reference numerals, and the description thereof will be omitted. An exhaust port 74 is formed on the side surface of the holder part 81. An exhaust apparatus 73 is connected to the exhaust port 74 through an exhaust pipe 75. The exhaust port 74 may be formed on the bottom surface of the holder part 81. The exhaust apparatus 73 reduces pressure inside the processing container 1 to a predetermined degree of vacuum via the exhaust port 74 and the holder part 81. A gas output port 98 is formed on the side surface of the opening 1c. A plurality of gas output ports 98 are provided in the side surface of the opening 1c at equal intervals. The gas output ports 98 are connected to the gas supply 15 via a pipe (not illustrated). The gas supply 15 supplies a predetermined gas to the gas output ports 98. For example, the gas supply 15 supplies a purging gas, such as a $N_2$ gas, in order to discharge particles generated in the support part 8, such as the bellows 83a. As a result, the vacuum processing apparatus 100 can discharge, from the exhaust port 74, particles generated in the support part 8. Thus, it is possible to suppress the generation of particles in the processing container 1.

According to the present disclosure, it is possible to suppress the generation of particles in the processing container while making the inclination of a stage adjustable.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A vacuum processing apparatus comprising:
   a processing container capable of maintaining an inside thereof in a vacuum atmosphere;
   a stage provided in the processing container and on which a substrate is placed;
   a support member passing through an opening formed at a bottom of the processing container and supporting the stage from below;
   a holder part located outside the processing container, wherein an end of the support member is fixed to the holder part to be integrally movable with the stage, and the holder part includes an inner turn portion formed to cover the opening from the outside of the processing container and forming a movable part of a spherical bearing along a circumferential direction of the opening;
   a flange part arranged around the opening on the outside of the processing container, wherein the flange part includes an outer turn portion engaged with the inner turn portion and forming a fixed part of the spherical bearing; and
   a sealing part configured to be expandable and contractible and provided inside the spherical bearing along the circumferential direction of the opening so as to airtightly seal at least a space between the flange part and the holder part.

2. The vacuum processing apparatus of claim 1, further comprising:
   an actuator fixed to the flange part and including a rod configured to be extendable and contractible and provided so as to come into contact with the holder part; and
   a controller configured to adjust an inclination of the holder part and the stage by controlling extension and contraction of the rod of the actuator.

3. The vacuum processing apparatus of claim 2, wherein the actuator comprises at least three actuators arranged at intervals in the circumferential direction of the opening.

4. The vacuum processing apparatus of claim 3, further comprising:
   an exhaust provided in the holder part and configured to exhaust the inside of the processing container through the opening and the holder part; and
   a plurality of gas output ports provided on a side surface of the opening at intervals in the circumferential direction to output a predetermined gas.

5. The vacuum processing apparatus of claim 1, further comprising:
   an exhaust provided in the holder part and configured to exhaust the inside of the processing container through the opening and the holder part; and
   a plurality of gas output ports provided on a side surface of the opening at intervals in the circumferential direction to output a predetermined gas.

6. A method of controlling a vacuum processing apparatus that comprises: a processing container capable of maintaining an inside thereof in a vacuum atmosphere; a stage provided in the processing container and on which a substrate is placed; a support member passing through an opening formed at a bottom of the processing container and supporting the stage from below; a holder part located outside the processing container, wherein an end of the support member is fixed to the holder part to be integrally movable with the stage, and the holder part includes an inner turn portion formed to cover the opening from the outside of the processing container and forming a movable part of a spherical bearing along a circumferential direction of the opening; a flange part arranged around the opening on the outside of the processing container, wherein the flange part includes an outer turn portion engaged with the inner turn portion and forming a fixed part of the spherical bearing; a sealing part configured to be expandable and contractible and provided inside the spherical bearing along the circumferential direction of the opening so as to airtightly seal at least a space between the flange part and the holder part; and an actuator fixed to the flange part and including a rod configured to be extendable and contractible and provided so as to come into contact with the holder part, wherein the vacuum processing apparatus further comprises:

an upper electrode disposed in the processing container to face the stage; and a film thickness sensor arranged around the upper electrode to be capable of detecting a film thickness of the substrate located within a predetermined detection range in a non-contact manner, and wherein the method comprises:

controlling the actuator such that the stage is tilted and the substrate placed on the stage is within a detection range of the film thickness sensor.

7. A method of controlling a vacuum processing apparatus that comprises: a processing container capable of maintaining an inside thereof in a vacuum atmosphere; a stage provided in the processing container and on which a substrate is placed; a support member passing through an opening formed at a bottom of the processing container and supporting the stage from below; a holder part located outside the processing container, wherein an end of the support member is fixed to the holder part to be integrally movable with the stage, and the holder part includes an inner turn portion formed to cover the opening from the outside of the processing container and forming a movable part of a spherical bearing along a circumferential direction of the opening; a flange part arranged around the opening on the outside of the processing container, wherein the flange part includes an outer turn portion engaged with the inner turn portion and forming a fixed part of the spherical bearing; a sealing part configured to be expandable and contractible and provided inside the spherical bearing along the circumferential direction of the opening so as to airtightly seal at least a space between the flange part and the holder part; and an actuator fixed to the flange part and including a rod configured to be extendable and contractible and provided so as to come into contact with the holder part, wherein the vacuum processing apparatus further comprises:

an upper electrode disposed in the processing container to face the stage, and wherein the method comprises:

arranging, on the stage, a distance measurement substrate capable of measuring a distance between the stage and the upper electrode for each of a plurality of positions within a placement surface of the stage; and controlling the actuator based on a result of measurement by the distance measurement substrate such that the stage is parallel to the upper electrode.

8. A method of controlling a vacuum processing apparatus that comprises: a processing container capable of maintaining an inside thereof in a vacuum atmosphere; a stage provided in the processing container and on which a substrate is placed; a support member passing through an opening formed at a bottom of the processing container and supporting the stage from below; a holder part located outside the processing container, wherein an end of the support member is fixed to the holder part to be integrally movable with the stage, and the holder part includes an inner turn portion formed to cover the opening from the outside of the processing container and forming a movable part of a spherical bearing along a circumferential direction of the opening; a flange part arranged around the opening on the outside of the processing container, wherein the flange part includes an outer turn portion engaged with the inner turn portion and forming a fixed part of the spherical bearing; a sealing part configured to be expandable and contractible and provided inside the spherical bearing along the circumferential direction of the opening so as to airtightly seal at least a space between the flange part and the holder part; and an actuator fixed to the flange part and including a rod configured to be extendable and contractible and provided so as to come into contact with the holder part, wherein the method comprises:

acquiring measurement data measured for each substrate process executed in the processing container and indicating an inclination of the stage with respect to a state of the substrate satisfying a predetermined condition;

sequentially executing substrate processes in the processing container; and controlling the actuator based on the measurement data whenever a time for switching a substrate process arrives.

* * * * *